United States Patent
Fickett et al.

(10) Patent No.: US 6,896,732 B2
(45) Date of Patent: May 24, 2005

(54) SOURCE MATERIAL FEEDER APPARATUS FOR INDUSTRIAL CRYSTAL GROWTH SYSTEMS

(76) Inventors: Bryan Fickett, 22962 SR14, Washougal, WA (US) 98871; Robert Bushman, 6411 Smoketree Ave., Oak Park, CA (US) 91377

(*) Notice: Subject to any disclaimer, the term of this patent is extended or adjusted under 35 U.S.C. 154(b) by 0 days.

(21) Appl. No.: 10/831,684

(22) Filed: Apr. 23, 2004

(65) Prior Publication Data

US 2004/0211358 A1 Oct. 28, 2004

Related U.S. Application Data

(60) Provisional application No. 60/465,694, filed on Apr. 24, 2003.

(51) Int. Cl.[7] .............................................. C30B 15/02
(52) U.S. Cl. ...................... 117/208; 117/209; 117/214; 117/215; 117/218; 117/33
(58) Field of Search .............................. 117/208, 209, 117/214, 215, 218, 33

(56) References Cited

U.S. PATENT DOCUMENTS

| | | | | |
|---|---|---|---|---|
| 4,940,568 A | * | 7/1990 | Hoyler et al. | 117/214 |
| 4,968,380 A | * | 11/1990 | Freedman et al. | 117/25 |
| 5,229,082 A | * | 7/1993 | Seidensticker et al. | 117/202 |
| 5,234,488 A | * | 8/1993 | Ichikawa et al. | 75/305 |
| 5,242,667 A | * | 9/1993 | Koziol et al. | 117/214 |
| 5,360,480 A | * | 11/1994 | Altekruger | 117/214 |
| 5,462,010 A | | 10/1995 | Takano et al. | |
| 5,876,496 A | * | 3/1999 | Nagai et al. | 117/33 |
| 5,900,055 A | * | 5/1999 | Nagai et al. | 117/33 |

* cited by examiner

*Primary Examiner*—Robert M. Kunemund
(74) *Attorney, Agent, or Firm*—Aaron T. Borrowman; Kelly Lowry & Kelly, LLP

(57) ABSTRACT

A raw material feeder apparatus for industrial crystal growth systems includes a hopper disposed within a vacuum chamber and adapted to hold a quantity of raw material therein. A slide is disposed adjacent to an opening of the hopper and configured to receive the raw material from the hopper thereon. The slide is selectively moved between an open feeding position and a closed non-feeding position. The slide and a door cooperatively close the opening of the hopper, or in their open state, control the flow of raw material from the hopper. A vibrator associated with the slide feeds the raw material from the slide into an outlet tube for conveyance of the raw material to the crystal growth system.

23 Claims, 4 Drawing Sheets

SOURCE MATERIAL FEEDER APPARATUS FOR INDUSTRIAL CRYSTAL GROWTH SYSTEMS

RELATED APPLICATION

This application claims priority to U.S. Provisional Application No. 60/465,694, filed on Apr. 24, 2003.

BACKGROUND OF THE INVENTION

The present invention generally relates to source material feeders used in industrial crystal growth processes. More particularly, the present invention resides in a source material feeder for such processes which converts batch process devices and systems into semi-continuous or continuous processes using granular or irregular shaped feed particles and controlled feeding into a large number of different crystal growth systems.

Synthetic crystal growth has been industrialized for decades, with little industry-wide process optimization. Innovation is usually confined within individual organizations that tend to keep new ideas secret. As a result, several unique and complex growing techniques have evolved, with growth equipment designed specifically for each manufacturer's process. Manufacturing challenges also vary among the different methods used. For instance, batch crystal growers are limited by the initial capacity of the melt crucible and growers who use shaped crystal growth methods have little or no options when selecting silicon source materials. Even though there are significant differences in method, the factors that drive operating costs are similar: raw materials such as polysilicon; consumable items like quartz crucibles; and electricity are major cost contributors.

Of all the crystalline materials manufactured commercially, silicon is in the highest demand. Most industrially grown silicon and other materials are still grown using inefficient batch processes. There are basically three types of specialized feeders presently available: (1) internal feed hoppers/rods that hang from seed cables; (2) gravity-fed external feeders; and (3) metering feeders used for continuous feeding of pellet/granular silicon. Some feeders are compatible only with specific types of crystal growth furnaces, and cannot be retrofit into other systems. Other designs are intended to feed only specific types of source material, such as a pelletized material. None can perform metered feeding of alternative source materials.

Most silicon is grown using the Czochralski (CZ) batch process. In this process, a silicon ingot is made by melting source materials in a crucible, dipping a seed crystal into the melt, and withdrawing the seed in such a manner as to achieve a single crystal of a specified diameter. Operators must then power-down and disassemble the furnace to reload it with a fresh crucible and source material after each ingot pull.

However, the CZ batch process has many limitations. The charge size is limited to approximately 60% of the actual crucible capacity as the unmelted raw material occupies a greater volume than the melted material. Throughput is hindered by non-productive set-up, heat-up, and cool-down cycles. This also increases energy costs significantly. Approximately 7–8% of the charge is unusable melt residue which remains attached to the crucible. Thus, the quartz crucibles, which are rather expensive (currently $500–$600 each), cannot be reused. In fact, the quartz crucible will actually crack due to the thermal cycling. Other furnace hot-zone components also break down due to thermal cycling and excessive handling. Moreover, advanced hot-zone processes that permit faster pull speeds and higher quality crystals cannot be used without further reducing crucible capacity.

To overcome these limitations, some have tried adding additional source materials. One technique uses an internal hopper or polysilicon rod that hangs from the seed cable to add materials after meltdown or in-between crystal pulls. However, efficiency gains using this method are offset by extra cycle time needed because the grown ingot has to be cooled and removed before the hopper is installed.

Others use an external feed hopper to feed pellet/granular silicon source material into the furnace without waiting for ingot removal. U.S. Pat. No. 5,462,010 to Takano et al. is directed to an apparatus which continuously supplies granular polycrystal silicon to a crucible of a semi-conductor single crystal pulling apparatus. Takano et al. disclose that the apparatus includes a main tank holding a large supply of the granular silicon source material. The granular material is fed into a sub-hopper having a supply controller in the form of rotary valves in a tube which exits into a smaller main hopper. Due to the granular/pellet nature of the material, the rotary valves can be selectively opened to permit the material to flow into the main hopper. The weight of the main hopper is monitored and the rotary valves opened to supply additional material as the crystal batch process proceeds and additional material is required.

This technique has proven very successful for a few companies, but requires source material manufactured by a proprietary fluidized bed process. This material is commercially available from only one company and expensive compared to other sources of raw material. Such granularized material has also been found to have undesirable characteristics resulting from the fluidized bed process. Thus, many industrial crystal growers prefer not to use the granular material. In addition to supply concerns, some existing feed hoppers are not designed to be refilled during a furnace run, and most are gravity-fed with little or no control of flow rate.

Batch casting techniques such as the Heat Exchange Method (HEM) are also used to grow single or polycrystalline silicon ingots. To cast a silicon ingot, source materials are loaded into a crucible and melted. The furnace temperature is lowered in a controlled way to directionally solidify the silicon. When growth is complete, the furnace is shut down. The limiting factor in casting ingots is crucible capacity. The unmelted raw material occupies a greater volume than the melted material.

Several commercial growing processes grow crystals to shape, usually in the form of ribbon or sheet. The Edge-Defined, Film-fed Growth (EFG) method, the String-Ribbon process and the Dendritic-Web technique all utilize continuous melt replenishment (CMR) during crystal growth. This means that silicon source materials are replaced, gram for gram, as the crystals are grown. CZ crystal growers can also apply this technology in order to gain better control of the electrical properties of the grown ingot. However, feeders currently available to perform continuous melt replenishment only accommodate the expensive pellet/granular silicon source materials. Therefore, users are locked into a single source supply, and CZ growers are reluctant to adopt the technology.

Accordingly, there is a continuing need for a feeder of source material for industrial crystal growth processes and systems which can convert the batch process into a semi-continuous or continuous process, and/or increasing the initial crucible volume, resulting in increased manufacturing efficiency. What is also needed is such a feeder which can be retrofit into a variety of existing systems. Moreover, such a feeder should be capable of accommodating large, irregular shaped feed particles and provide controlled feeding into the crystal growth system. The present invention fulfills these needs and provides other related advantages.

SUMMARY OF THE INVENTION

The present invention resides in a raw material feeder apparatus for industrial crystal growth systems. The feeder apparatus of the present invention can be utilized in silicon crystal growth processes, as well as other synthetic crystals, such as sapphire, YAG, Gallium, Arsenide, Rutile, etc. The feeder apparatus of the present invention is particularly adapted for use with larger and irregularly shaped raw material, but it can also be used with the pellet/granular source material as well. The feeder apparatus of the present invention allows topping off, semi-continuous raw material replenishment or continuous material replenishment enabling multiple uses of a crucible in such industrial crystal growth systems and significant savings in electricity and other costs.

The feeder apparatus of the present invention is generally comprised of a housing defining a vacuum chamber having houses a hopper adapted to hold a quantity of raw material therein. Preferably, a fill port is formed in the chamber for accessing the hopper.

An adjustable opening is formed in the hopper which is adapted to permit the raw material to flow therethrough. Typically, the opening has a door which is selectively positionable and retractable relative to the opening of the hopper to control the flow of material through the opening. A slide is disposed adjacent to the opening of the hopper and configured to receive the raw material from the hopper thereon. Means are provided for selectively moving the slide between a generally horizontal raw material non-feeding position and a generally downwardly angled material feeding position. The door and the slide cooperatively close the opening of the hopper when the slide is moved into its non-feeding position and the door is moved towards the slide.

In one embodiment, the slide moving means comprises a manually actuated assembly, such as a hand crank coupled to at least one compression spring acting on the slide, for moving the slide from a generally horizontal non-feeding position to a downwardly angled feeding position. In another embodiment, the slide moving means comprises a motorized assembly for moving the slide from a generally horizontal non-feeding position to a downwardly angled feeding position.

A vibrator is associated with the slide for the feeding of the raw material from the slide and into an outlet tube disposed relative to the slide and adapted to receive the raw material from the slide and convey the raw material to the crystal growth system. Typically, a controller is used to alter the vibration of the vibrator for minimizing, or even stopping, the flow of material from the slide to the outlet tube or for increasing the flow thereof. Typically, an isolation valve is included in the outlet tube to seal the apparatus from the industrial crystal growth system.

In some instances, particularly when the apparatus is used as a continuous feeder, a sensor is used for measuring the amount of raw material in the hopper. The sensor is coupled to a controller which is adapted to alter the vibration of the vibrator and the amount of raw material introduced into the industrial crystal growth system.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

Figure 1:
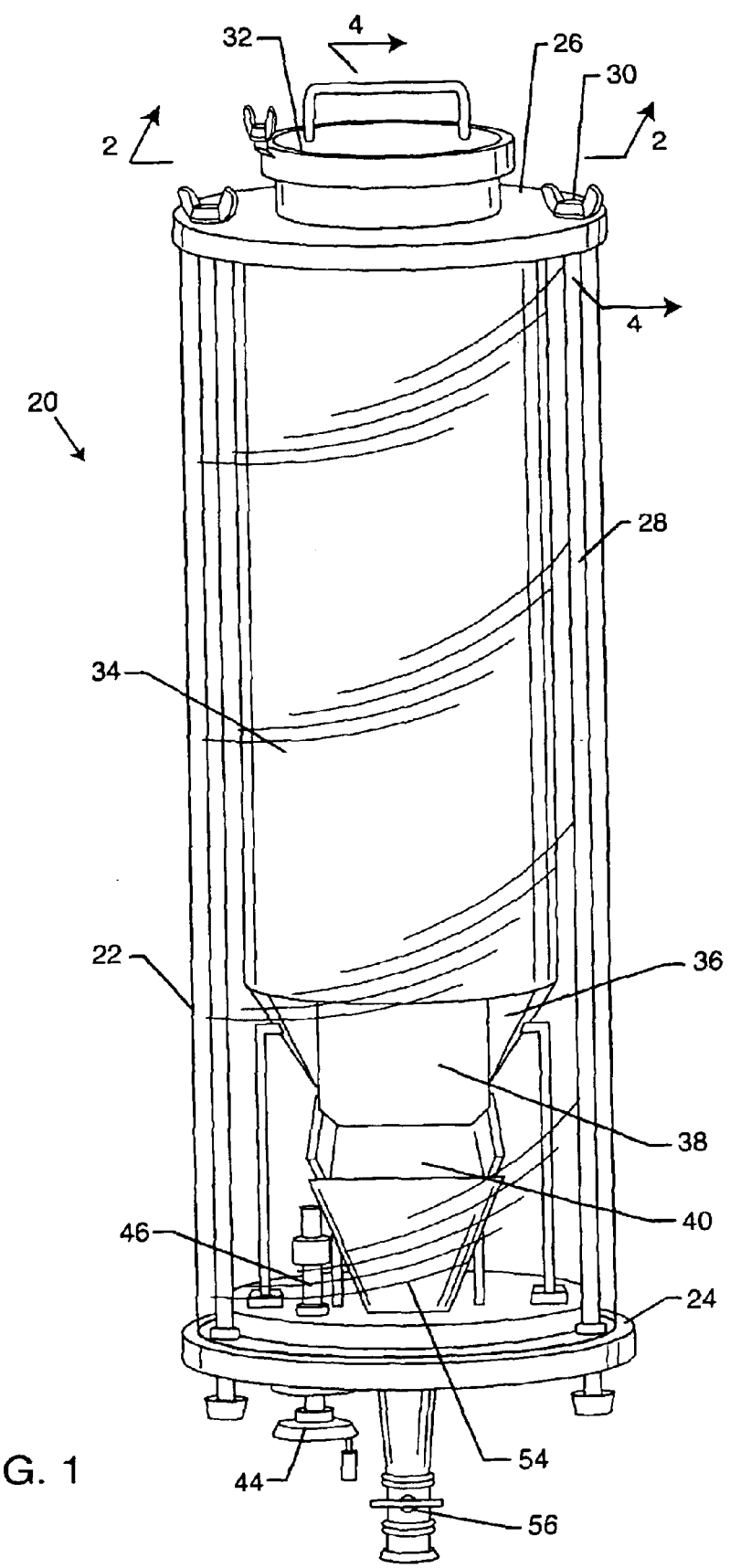
FIG. 1 is a front perspective view of a feeder apparatus embodying the present invention.

As shown in the drawings for purposes of illustration, the present invention resides in a feeder apparatus, generally referred to by the reference number 20, which feeds raw material to a crystal growing furnace of an industrial crystal growth system. Typically, the raw material comprises silicon, but can also be other material such as sapphire, YAG, Gallium, Arsenide, Rutile, etc. A particularly novel aspect of the present invention is that it is designed such so as to not only semi-continuously or continuously supply pelletized/grannular raw material, but also relatively large (up to 60 mm) and irregularly sized and shaped feed particles of raw material. The feeder apparatus 20 of the present invention can also utilize recycled feed stock, which can be obtained from a number of sources at lower cost. As will be more fully described herein, the feeder apparatus 20 of the present invention allows a single melting crucible to be topped off after initial meltdown, which can increase production by 40% alone. The feeder apparatus 20 of the present invention is also designed such that a semi-continuous or continuous feeding can occur such that the crucible can be utilized for several batches, saving the cost of replacing the crucible as well as the energy costs associated with cooling down and heating the crucible in a typical batch process. The design of the feeder apparatus 20 is such so as to be retrofit to a number of different existing systems.

With reference now to FIG. 1, a particularly preferred embodiment of the feeder apparatus 20 of the present invention is illustrated. The apparatus 20 includes an outer housing 22 adapted to form a vacuum chamber therein. Preferably, the housing 22 is comprised of a transparent material such as cast acrylic, quartz or Pyrex glass. End caps 24 and 26 enclose the ends of the cylindrical housing 22. Seals, such as O-rings or the like may be used to seal the inner chamber of the housing 22. The end caps 24 and 26 are tightly fastened to the housing 22 by locking means, such as the illustrated bolts 28 and thumb screws 30 located on the outside of the housing. A fill port 32 is typically formed in the upper end cap 26, and also capable of being sealed to the end cap 26, for selectively accessing the inner chamber of the housing 22.

A hopper 34 is disposed within the housing 22. The hopper 34 is configured to hold a predetermined amount of raw material therein, and typically has a V-shaped outlet or opening 36 through which the raw material flows out of the hopper 34. A door 38 is slidably positionable over at least a portion of the opening 36 and away from the opening 36 so as to alter the flow of raw material through the opening 36.

A slide 40 is disposed under the outlet opening 36. The slide is in the form of a generally planar plate having angled wings extending on either side thereof so as to receive the raw material from the hopper 34 thereon.

Figure 3:
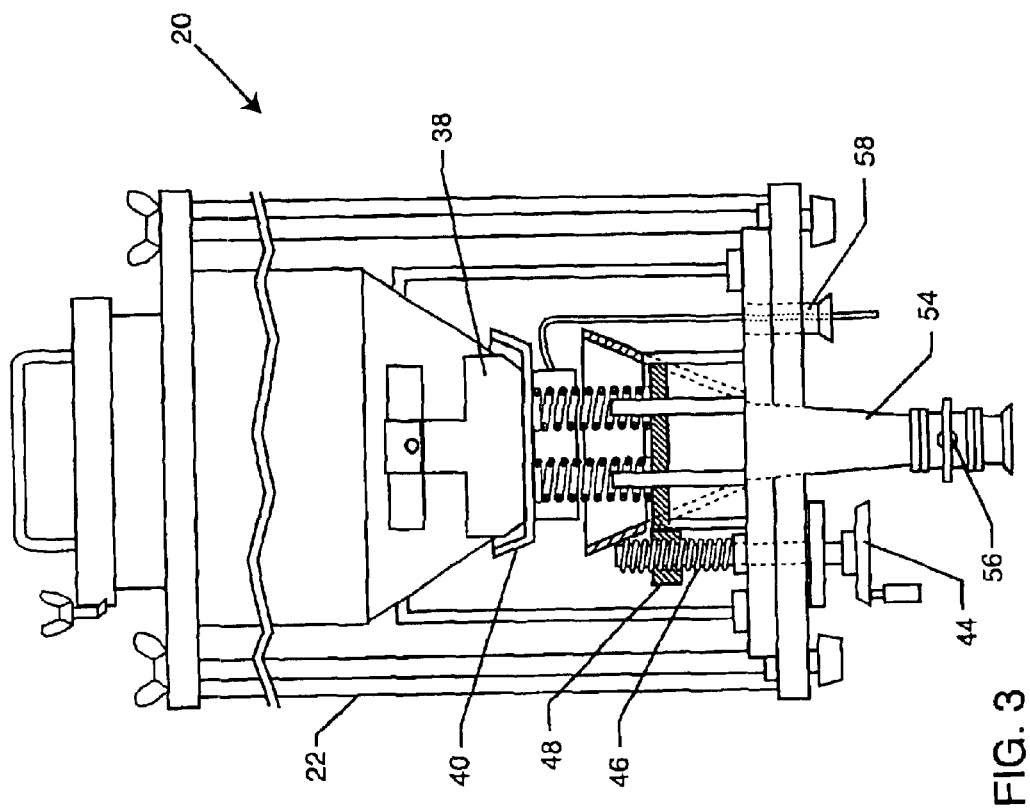
FIG. 3 is a view similar to FIG. 2, illustrating the slide in a closed or non-feeding position.
Figure 2:
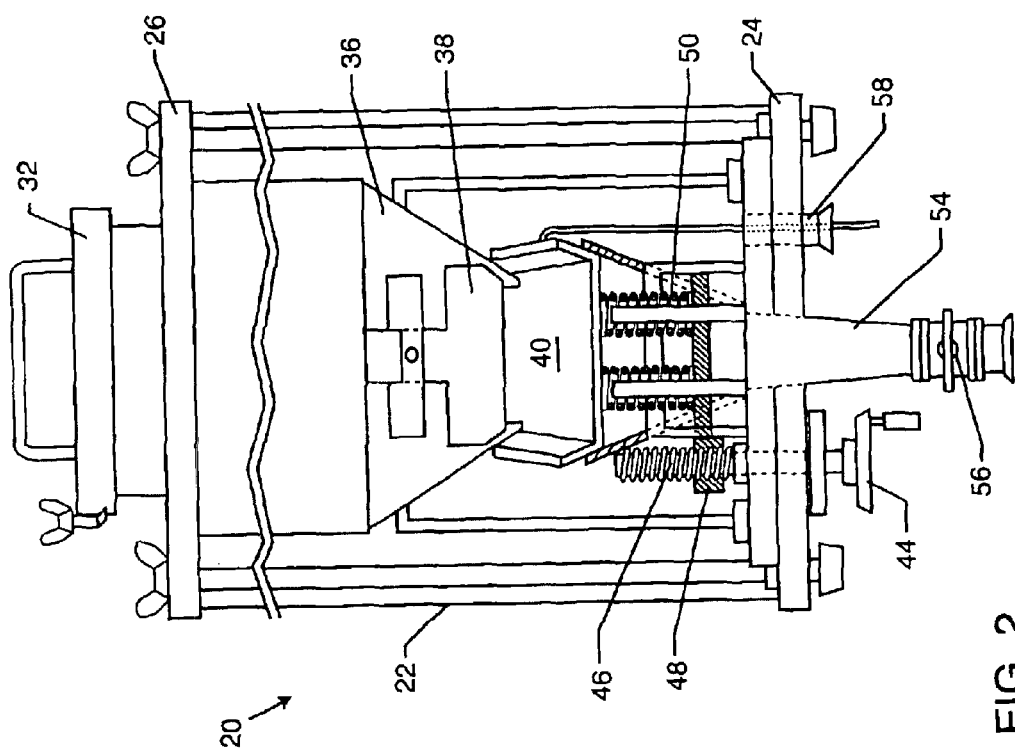
FIG. 2 is a partly sectioned and fragmented elevational view of the apparatus of FIG. 1, illustrating a slide thereof in an open and feeding position.
Figure 5:
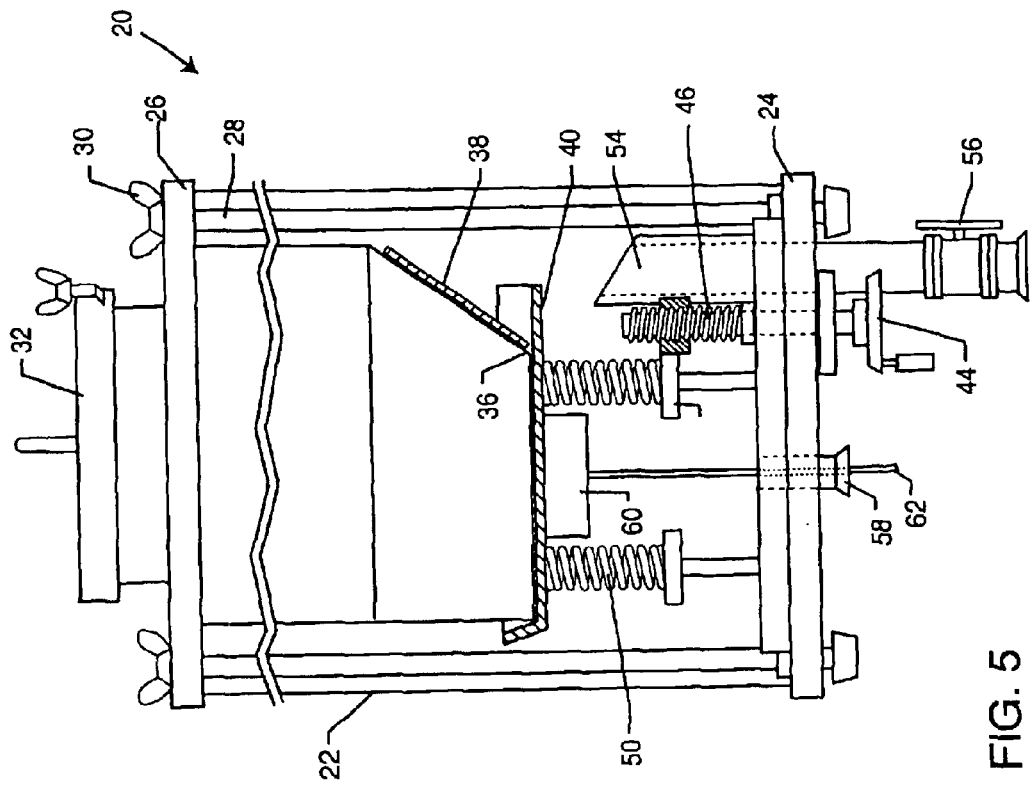
FIG. 5 is a partially sectioned and fragmented side elevational view of the apparatus of FIG. 1, illustrating the slide thereof in a closed position.
Figure 4:
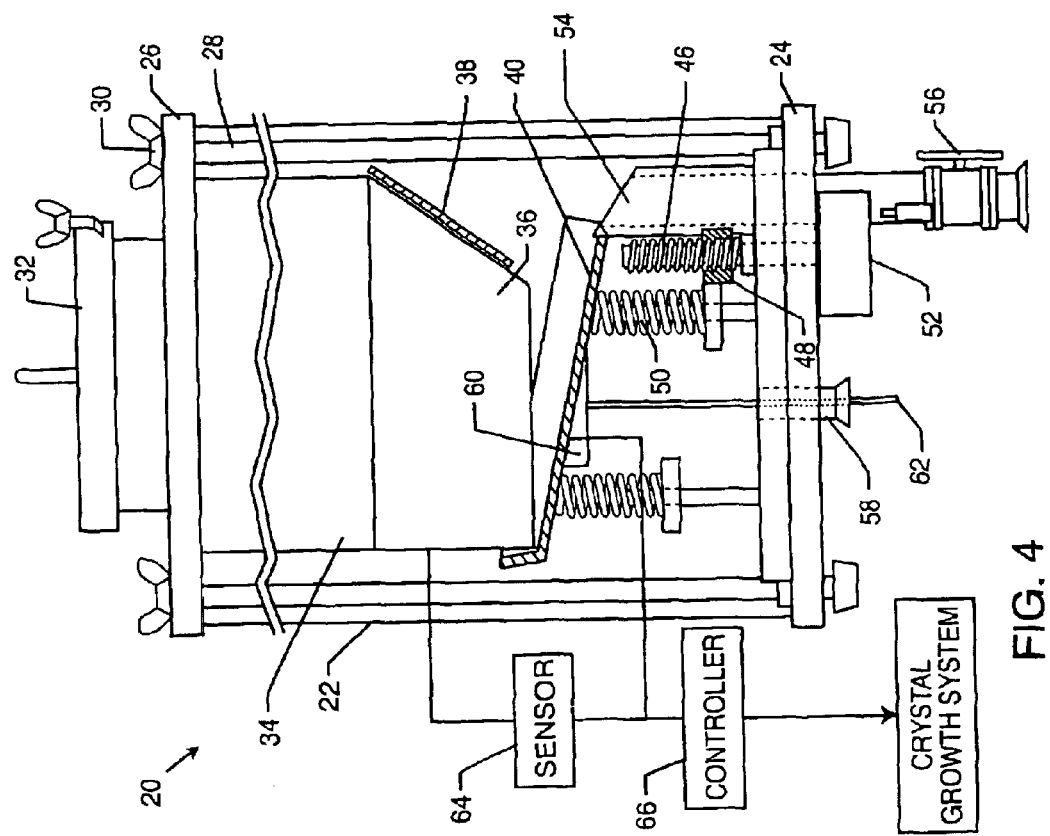
FIG. 4 is a partially sectioned and fragmented side elevational view of the apparatus of FIG. 1, illustrating the slide in an open feeding position, and controls for controlling the amount of raw material flowing through the apparatus.
Figure 7:
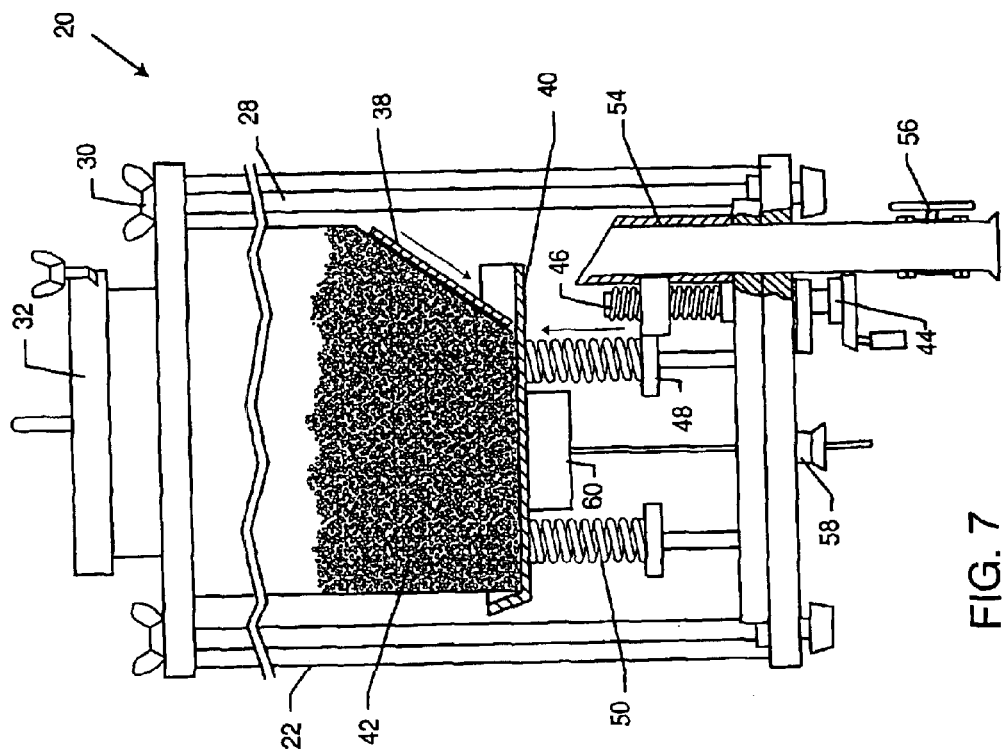
FIG. 7 is a side elevational view similar to FIG. 6, illustrating the opening of the hopper closed due to the closed position of a slide of the apparatus, preventing raw material from flowing therethrough.

With reference now to FIGS. 2–4, the slide 40 is movable between an open or feeding position, as illustrated in FIGS. 1, 2 and 4; and a closed or non-feeding position, as illustrated in FIGS. 3 and 5. In the illustrated particularly preferred embodiment, the open or feeding position is a downwardly directed angle, whereas the closed and non-feeding position is generally at a level or horizontal position. As shown in FIGS. 5 and 7, the door 38 and slide 40 cooperatively close off the outlet opening 36 of the hopper 34 when the slide 40 is in hits generally horizontal and closed position and the door 38 is lowered over the opening 36.

Figure 6:
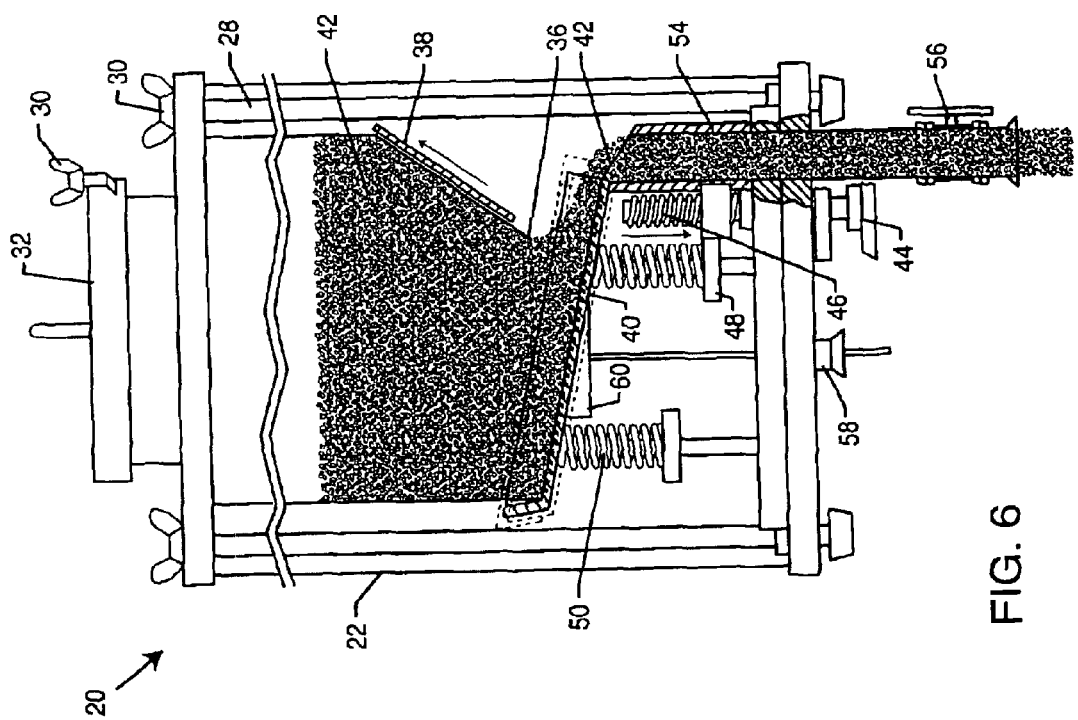
FIG. 6 is a partially sectioned and fragmented side elevational view, similar to FIG. 4, illustrating raw material being fed from the apparatus.

While in these closed positions, the raw material cannot flow out whatsoever from the hopper 34. However, when the slide 40 is angled downwardly and opened, as illustrated in FIGS. 4 and 6, the raw material 42 begins to flow from the hopper 34 onto the slide 40. The flow of the raw material 42 onto the slide 40 is controlled by the downward angle of the slide 40 as well as the position of the door 38. For small particles, the door 38 may not be raised whatsoever. However, for larger particles the door 38 can be moved upwardly away from the opening 36 to permit the flow of the large and irregularly shaped material through the opening 36 and onto the slide 40. The combination of the configuration of the slide 40, the hopper opening 36 and the adjustable door 38 allow the apparatus 20 to accommodate irregularly shaped and sized raw material sources. Of course, this is beneficial, as described above.

The means for adjusting the position of the slide 40 from a generally horizontal and closed position to a downwardly directed angled and open feeding position is either by manual means or automatic or motorized means.

With reference to FIGS. 2 and 3, a manual assembly for moving the slide 40 is illustrated. The assembly includes a hand crank 44 which rotates a screw 46 which interacts with one or more platforms 48 for raising or lowering the slide 40. One or more of the springs 50, which are typically in contact with the bottom surface of the slide 40, act upon the slide 40 to allow it to vibrate. Typically, four compression springs 50 are used, with a pair of compression springs 50 towards the leading edge of the slide 40.

Alternatively, as illustrated in FIG. 4, a motor 52 has a threaded shaft 46 which interacts with the springs 50, such as by the platform 48. In this manner, an operator of the apparatus 20 could utilize an electric switch, such as push button, to open and close the slide 40. Also, the use of a motor enables computer control of the opening and closing of the slide 40, as will be more fully discussed herein. Although the motor 52 is illustrated as being disposed exteriorally of the apparatus 20, it can also be disposed within the apparatus 20.

An outlet tube 54 is disposed relative to the slide 40 such that as the slide is lowered, raw material can flow from the slide and into the outlet tube 54, as illustrated in FIG. 6. The outlet tube 54 typically has a flared end defining the opening thereof so as to match the dimension of the slide 40, as illustrated in FIG. 1. The outlet tube extends from within the housing 22 to outside of the housing 22 for connection to the pertinent structure of the industrial crystal growth system that the apparatus 20 is attached to such that the raw material 42 can be dispensed into the melting furnace or crucible of such system (not shown).

Within the outlet tube 54 is disposed an isolation valve 56, which can be selectively opened and closed. Although the isolation valve 56 can be used to alter the flow of raw material 42 through the outlet tube 54, more typically the isolation valve 56 is used to isolate the apparatus 20 in a pressure sense from the industrial crystal growth system that it is attached to.

Operation of such systems typically occurs under a vacuum with gas impurities, such as oxygen, removed from the overall system. Thus, the apparatus 20 of the present invention includes a port 58 through which the air or atmosphere within the apparatus 20 can be removed and purged with argon or another inert gas to create a state of vacuum or negative pressure within the housing 22 and apparatus 20. When the hopper 34 needs replenishment of raw material, for example, the isolation valve 56 is closed and the fill port 32 is open to access the hopper 34. The apparatus 20 is then placed in a vacuum or low pressure state and the isolation valve 56 opened to continue the charging or feeding process into the crystal growth system.

When using small-sized raw materials, such as the pelletized or granular raw material silicone, a sufficient downward angle of the slide 40 will permit the raw material 42 to exit the hopper 34 and flow into the outlet tube 54. However, in other instances, particularly with large and irregular-shaped raw material, the raw material 42 will not readily flow from the hopper 34 into the outlet tube 54. Thus, a vibrating device 60 is disposed in association with the slide 40 to controllably cause the raw material 42 to flow past the slide 42 and into the outlet tube 54. The vibrator 60 is preferably adjustable such that the degree of vibration imparted to the slide 40 can be adjusted to control the flow of the raw material 42. Typically, the feed rate can be adjusted from 0 to 5 kilograms per minute. The electrical lead 62 of the vibrator 60 extends through a port, such as the vacuum port 58 so that a vacuum state can be created within the housing chamber 22. Thus, in some instances, lowering the slide 40 to its most downwardly angle is still insufficient to cause the raw material 42 to flow over the slide 40. The vibrating device 60 is activated and the amount of vibration controlled to cause the raw material 42 to flow at a selected and controlled rate. This is particularly advantageous as deactivating the vibrator will cause an immediate cessation of flow of the raw material 42 into the outlet tube 54. Thus, the combination of the downward angle of the slide 40 and the amount of vibration imparted by the vibrator 60 enables the operator to carefully and selectively control the flow of raw material 42 into the crystal growth system that the apparatus 20 is attached to.

With particular reference now to FIG. 4, when operating in a continuous manner, the amount of raw material 42 fed over a given time must be sensed and controlled. Thus a sensor, such as a load cell or other weight sensor, optical sensor or any other appropriate sensor measures the amount of raw material dispensed from the hopper 34. A controller 66, such as a CPU or other computerized controller monitors the level of the raw material 42 compared to the exhaustion of the melted raw material creating the crystal within the crystal growth system. The controller can also be operatively connected to the vibrator 60 to control the amount of vibration imparted to the slide 40, as well as the motor 52 which adjusts the angle of the slide 40 to decrease or increase the amount of raw material 42 loaded into the system at any given time.

All feeder 20 components that come into contact with the raw feed materials are preferably fabricated using flat plates, which simplifies manufacturing as well as facilitates decontamination by acid etching or the like. The feeder apparatus 20 components which come into contact with the raw material, such as the inner surface of the hopper 34, the slide 40, and the outlet tube 54 can be comprised of different materials depending upon the end user's specific needs. For example, silicon growers with tight purity tolerances may desire that these components are manufactured from semiconductor grade polysilicon, virtually eliminating any potential for foreign contamination. Other lower-costing construction materials such as polypropylene, or higher strength material like stainless steel or silicon carbide can also be used.

In use, the feeder apparatus 20 is installed on a crystal growth furnace or other appropriate extension of the crystal growth system, using feed tubes or the like to provide delivery from the outlet tube 54 and into the melt crucible (not shown). With the isolation valve 56 closed, the hopper 34 can be filled at any time. The pressure within the apparatus 20 is brought to atmospheric pressure and the fill cap 32 is open. The slide 40 and door 38 are brought into closed positions and the raw material, such as silicon, is poured into the hopper 34. Once filled, the cap 32 is closed and sealed and oxygen is removed through a series of vacuum pump-downs and argon gas purges.

The slide 40 is then angled downwardly and the door 38 adjusted, as necessary to cause the raw material 42 within the hopper 34 to fall onto the slide 40. In most cases, the vibrator 60 will need to be activated to cause the raw material 42 to slide off of the slide 40 and into the outlet tube 54, where it passes into the crystal growth system as the isolation valve 56 was previously opened once the apparatus 20 was properly pressurized. The flow rate and amount of raw material 42 introduced into the outlet 54 can be controlled, as described above.

The feeder apparatus 20 can be used in three different ways: to top-off the crucible; perform batch recharging; or to continuously replenish the melt.

When topping-off a crucible, the growth furnace is setup as for a standard batch run. The furnace temperature is ramped up until melting begins. As the raw materials of the crucible melt, settling occurs similar to ice melting in a container. At this point, raw material 42 is fed through the opened outlet tube 54 by opening the slide 40 and activating the vibrator 60. Once the hopper 34 is empty, or the crucible filled, the vibrator 60 is turned off and the isolation valve 56 closed. This is repeated until the crucible is filled with melted raw material. As stated above, utilization of the apparatus 20 of the present invention can increase by up to 40% the output of a single batch due to the recharging of the crucible after settling.

Batch recharging in between crystal pulls is performed in a similar manner except that the feeding is performed after each growing ingout is pulled free from the melt. By recharging the crucible between runs, time consuming cooldown, set-up and power-up cycles are avoided. Many yield losses resulting from set-up errors or contamination introduced during set-up are eliminated, and a significant amount of electricity is saved in the process. A single crucible can be used multiple times in such a batch recharging method.

To perform continuous melt replenishment, the hopper 34 is mounted on a load cell or other means for sensing the level of raw material 42 therein, and the slide 40 is lowered to an optimum position. The system controller 66 operates the vibrator 60 on an as-needed basis to feed the raw material 42 into the outlet tube 54 and replenish the material within the crystal growth system.

Standardized connections are typically used between the apparatus 20 and the industrial crystal growth system, thus making the feeder apparatus 20 of the present invention universal in nature and capable of being retrofit to virtually any existing crystal growth system. Use of the apparatus 20 of the present invention can convert a batch process into a semi-continuous or even a continuous replenishment process, thus resulting in increased manufacturing efficiency. The feeder apparatus 20 of the present invention can accomplish this using large, irregularly shaped feed particles, or alternatively less desirable pelletized or granular particles, and provide controlled feeding into any crystal growth system. The present invention provides many benefits including increased product yield, higher-through put, minimized scrap, reduced material handling and/or improved resistivity control. Use of the apparatus 20 of the present invention allows large irregularly shaped material, recycled feed stock and the like to be utilized which is much less expensive than the traditional raw material. Expensive crucibles can be reused and the energy costs associated with traditional batch processes reduces significantly.

Although several embodiments of the present invention have been described in detail for purposes of illustration, various modifications of each may be made without departing from the spirit and scope of the invention. Accordingly, the invention is not to be limited, except as by the appended claims.

What is claimed is:

1. A raw material feeder apparatus for industrial crystal growth systems, the apparatus comprising:
   a vacuum chamber;
   a hopper disposed within the vacuum chamber and adapted to hold a quantity of raw material therein;
   an adjustable opening formed in the hopper adapted to permit the raw material to flow therethrough;
   a slide disposed adjacent to the opening of the hopper and configured to receive the raw material from the hopper thereon;
   means for selectively moving the slide between a raw material feeding position and a non-feeding position; and
   an outlet tube disposed relative to the slide to receive the raw material from the slide and convey the raw material to the crystal growth system.

2. The feeder apparatus of claim 1, including a vibrator associated with the slide for the feeding of the raw material from the slide and into the outlet tube.

3. The feeder apparatus of claim 2, including controller adapted to alter the vibration of the vibrator.

4. The feeder apparatus of claim 2, including a sensor for measuring the amount of raw material in the hopper.

5. The feeder apparatus of claim 4, wherein the sensor is coupled to a controller adapted to alter the vibration of the vibrator.

6. The feeder apparatus of claim 1, including a fill port formed in the chamber for accessing the hopper.

7. The feeder apparatus of claim 1, wherein the adjustable opening comprises a door selectively positionable and retractable relative to the opening of the hopper.

8. The feeder apparatus of claim 7, wherein the door and the slide cooperatively close the opening of the hopper when the slide is moved into its non-feeding position and the door is moved towards the slide.

9. The feeder apparatus of claim 1, wherein the slide moving means comprises a manually actuated assembly for moving the slide from a generally horizontal non-feeding position to a downwardly angled feeding position.

10. The feeder apparatus 9, wherein the manually actuated assembly comprises a hand crank coupled to at least one compression spring acting on the slide.

11. The feeder apparatus of claim 1, wherein the slide moving means comprises a motorized assembly for moving the slide from a generally horizontal non-feeding position to a downwardly angled feeding position.

12. The feeder apparatus of claim 1, including an isolation valve in the outlet tube.

13. A raw material feeder apparatus for industrial crystal growth systems, the apparatus comprising:
   a vacuum chamber;
   a hopper disposed within the vacuum chamber and adapted to hold a quantity of raw material therein;
   a door selectively positionable and retractable relative to an opening of the hopper for controlling the flow of raw material from the opening of the hopper;
   a slide disposed adjacent to the opening of the hopper and configured to receive the raw material from the hopper;
   means for selectively moving the slide between a generally downwardly angled raw material feeding position and a generally horizontal non-feeding position;
   a vibrator associated with the slide for the feeding of the raw material from the slide and into the outlet tube; and
   an outlet tube disposed relative to the slide to receive the raw material from the slide and convey the raw material to the crystal growth system, the outlet tube including an isolation valve configured to be selectively opened or closed.

14. The feeder apparatus of claim 13, including controller adapted to alter the vibration of the vibrator.

15. The feeder apparatus of claim 14, including a sensor for measuring the amount of raw material in the hopper, wherein the sensor is coupled to a controller adapted to alter the vibration of the vibrator.

16. The feeder apparatus of claim 13, including a fill port formed in the chamber for accessing the hopper.

17. The feeder apparatus of claim 13, wherein the door and the slide cooperatively close the opening of the hopper when the slide is moved into its non-feeding position and the door is moved towards the slide.

18. The feeder apparatus of claim 13, wherein the slide moving means comprises a manually actuated assembly for moving the slide from the non-feeding position to the feeding position, the assembly including a hand crank coupled to at least one compression spring that engages the slide.

19. The feeder apparatus of claim 13, wherein the slide moving means comprises a motorized assembly for moving the slide from the non-feeding position to the feeding position.

20. A raw material feeder apparatus for industrial crystal growth systems, the apparatus comprising:
   a vacuum chamber;
   a hopper disposed within the vacuum chamber and adapted to hold a quantity of raw material;
   a fill port formed in the chamber for accessing the hopper;
   a door selectively positionable and retractable relative to an opening of the hopper for controlling the flow of raw material through the opening;
   a slide disposed adjacent to the opening of the hopper and configured to receive the raw material from the hopper, wherein the door and slide cooperatively close the opening of the hopper when the door is closed and the slide is disposed in a non-feeding horizontal position;
   means for selectively moving the slide between a raw material feeding position and the non-feeding position;
   a vibrator associated with the slide for the feeding of the raw material from the slide and into the outlet tube;
   a controller adapted to selectively alter the vibration of the vibrator;
   an outlet tube disposed relative to the slide to receive the raw material from the slide and convey the raw material to the crystal growth system, the outlet tube including an isolation valve configured to be selectively opened or closed.

21. The feeder apparatus of claim 20, including a sensor for measuring the amount of raw material in the hopper, wherein the sensor is coupled to a controller adapted to alter the vibration of the vibrator.

22. The feeder apparatus of claim 20, wherein the slide moving means comprises a manually actuated assembly for moving the slide from a generally horizontal non-feeding position to a downwardly angled feeding position, the assembly including a hand crank coupled to at least one compression spring that engages the slide.

23. The feeder apparatus of claim 20, wherein the slide moving means comprises a motorized assembly for moving the slide from a generally horizontal non-feeding position to a downwardly angled feeding position.

* * * * *